US010658163B2

(12) United States Patent
Nagatsu et al.

(10) Patent No.: US 10,658,163 B2
(45) Date of Patent: May 19, 2020

(54) TANTALUM SPUTTERING TARGET, AND PRODUCTION METHOD THEREFOR

(71) Applicant: JX Nippon Mining & Metals Corporation, Tokyo (JP)

(72) Inventors: Kotaro Nagatsu, Ibaraki (JP); Shinichiro Senda, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 203 days.

(21) Appl. No.: 15/543,738

(22) PCT Filed: May 17, 2016

(86) PCT No.: PCT/JP2016/064538
§ 371 (c)(1),
(2) Date: Jul. 14, 2017

(87) PCT Pub. No.: WO2016/190160
PCT Pub. Date: Dec. 1, 2016

(65) Prior Publication Data
US 2017/0372879 A1     Dec. 28, 2017

(30) Foreign Application Priority Data

May 22, 2015   (JP) ................................ 2015-104294

(51) Int. Cl.
*C23C 14/34*     (2006.01)
*H01J 37/34*     (2006.01)
(Continued)

(52) U.S. Cl.
CPC .......... *H01J 37/3426* (2013.01); *B22D 7/005* (2013.01); *C22C 27/02* (2013.01);
(Continued)

(58) Field of Classification Search
CPC .................................................. H01J 37/3426
See application file for complete search history.

(56) References Cited

U.S. PATENT DOCUMENTS 6,331,233 B1   12/2001   Turner
6,348,113 B1    2/2002   Michaluk et al.
(Continued)

FOREIGN PATENT DOCUMENTS

| EP | 0902102 A1 | 3/1999 |
|---|---|---|
| JP | 2001-295035 A | 10/2001 |
| JP | 2002-363736 A | 12/2002 |

*Primary Examiner* — Jason Berman
(74) *Attorney, Agent, or Firm* — Howson & Howson LLP

(57) ABSTRACT

Provided is a tantalum target, wherein, when a direction normal to a rolling surface (ND), which is a cross section perpendicular to a sputtering surface of a target, is observed via an electron backscatter diffraction pattern method, an area ratio of crystal grains of which a {100} plane is oriented in the ND is 30% or more. An object of the present invention is to provide a tantalum sputtering target in which a deposition rate can be appropriately controlled under high-power sputtering conditions. When sputter-deposition is performed using this kind of a tantalum target, it is possible to form a thin film having superior film thickness uniformity and improve the productivity of the thin film formation process, even for micro wiring.

1 Claim, 3 Drawing Sheets

(51) Int. Cl.
  *C22F 1/18*     (2006.01)
  *C22C 27/02*    (2006.01)
  *B22D 7/00*     (2006.01)
  *C23C 14/14*    (2006.01)
  *C22F 1/00*     (2006.01)

(52) U.S. Cl.
  CPC ............... *C22F 1/18* (2013.01); *C23C 14/14* (2013.01); *C23C 14/34* (2013.01); *C23C 14/3414* (2013.01); *C22F 1/00* (2013.01)

(56) References Cited

U.S. PATENT DOCUMENTS

| | | | |
|---|---|---|---|
| 6,348,139 B1 | 2/2002 | Shah et al. | |
| 6,676,728 B2 | 1/2004 | Han et al. | |
| 7,081,148 B2 | 7/2006 | Koenigsmann et al. | |
| 7,101,447 B2 | 9/2006 | Turner | |
| 7,156,963 B2 | 1/2007 | Oda | |
| 7,699,948 B2 | 4/2010 | Oda | |
| 7,716,806 B2 | 5/2010 | Oda | |
| 7,740,717 B2 | 6/2010 | Oda | |
| 7,892,367 B2 | 2/2011 | Oda | |
| 7,998,287 B2 | 8/2011 | Wickersham, Jr. et al. | |
| 8,172,960 B2 | 5/2012 | Oda et al. | |
| 8,177,947 B2 | 5/2012 | Miyashita | |
| 8,231,745 B2 | 7/2012 | Wickersham, Jr. et al. | |
| 8,250,895 B2 | 8/2012 | Bozkaya et al. | |
| 8,252,126 B2 | 8/2012 | Matera et al. | |
| 8,425,696 B2 | 4/2013 | Oda et al. | |
| 8,500,928 B2 | 8/2013 | Matera et al. | |
| 8,747,633 B2 | 6/2014 | Nakashima et al. | |
| 9,085,819 B2 | 7/2015 | Senda et al. | |
| 9,095,885 B2 | 8/2015 | Jepson et al. | |
| 9,150,957 B2 | 10/2015 | Holcomb et al. | |
| 2002/0112789 A1* | 8/2002 | Jepson | C22C 27/02 148/422 |
| 2007/0023281 A1* | 2/2007 | Oda | C23C 14/3414 204/298.12 |
| 2011/0266145 A1 | 11/2011 | Fukushima et al. | |
| 2012/0031756 A1 | 2/2012 | Fukushima et al. | |
| 2012/0037501 A1 | 2/2012 | Fukushima et al. | |
| 2012/0061672 A1 | 3/2012 | O'Rourke et al. | |
| 2012/0132523 A1 | 5/2012 | Hagihara et al. | |
| 2012/0267236 A1 | 10/2012 | Nakashima et al. | |
| 2013/0092534 A1 | 4/2013 | Senda et al. | |
| 2013/0098759 A1 | 4/2013 | Senda et al. | |
| 2014/0242401 A1 | 8/2014 | Senda et al. | |
| 2015/0064056 A1 | 3/2015 | Nagatsu et al. | |
| 2015/0279637 A1 | 10/2015 | Senda et al. | |
| 2015/0329959 A1 | 11/2015 | Senda et al. | |
| 2015/0348765 A1 | 12/2015 | Senda et al. | |
| 2016/0208377 A1 | 7/2016 | Oda | |
| 2016/0217983 A1 | 7/2016 | Oda | |
| 2018/0105926 A1 | 4/2018 | Nagatsu et al. | |

\* cited by examiner

[Fig. 1]
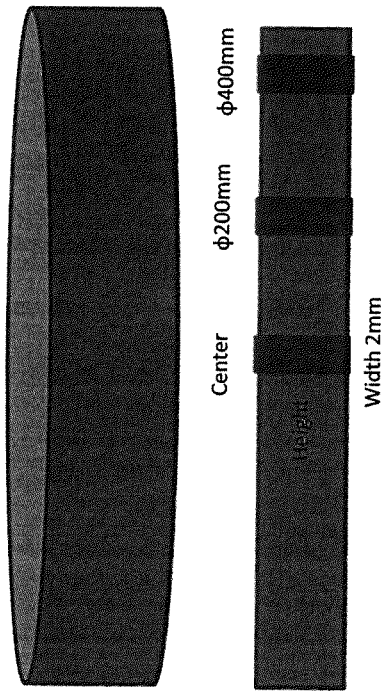
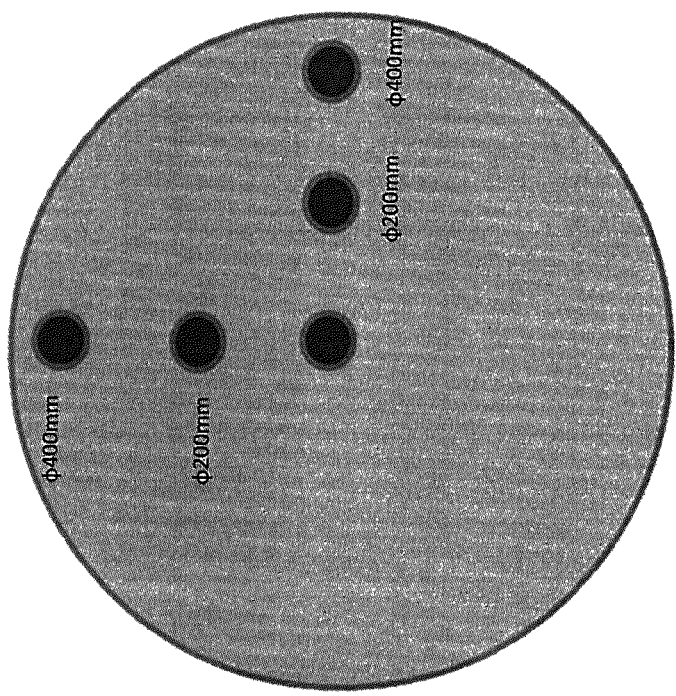

[Fig. 2]
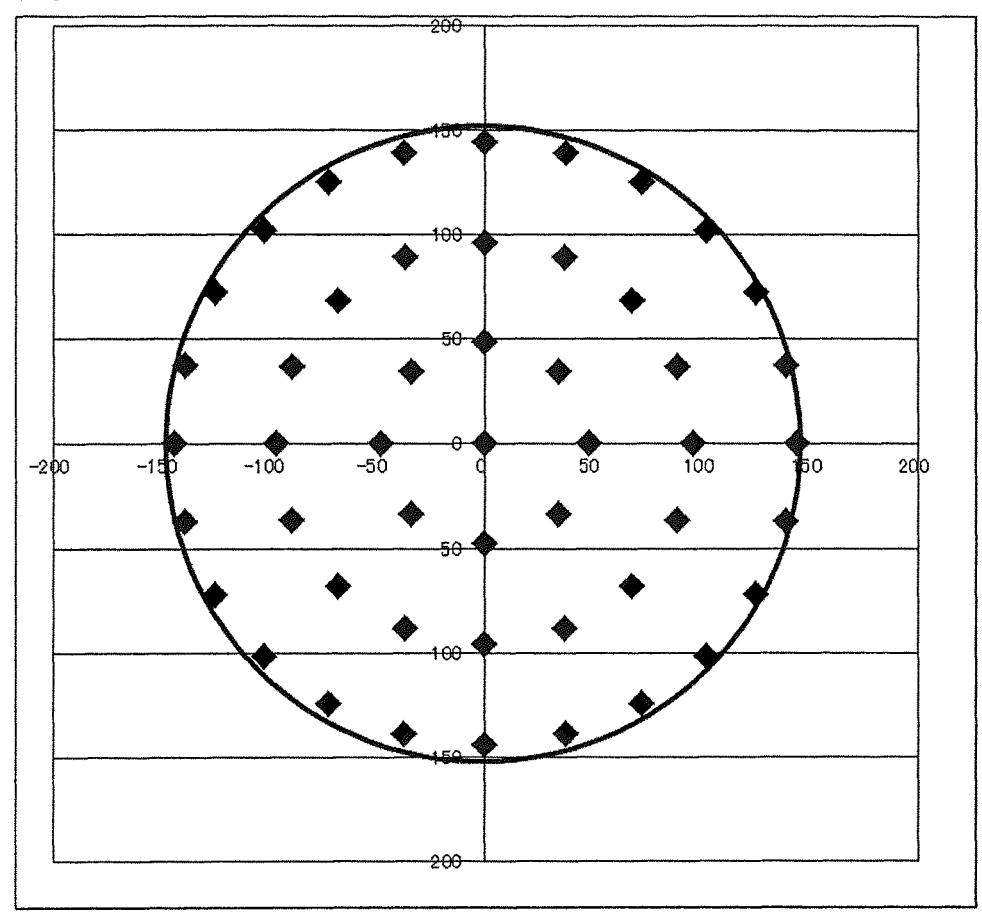

[Fig. 3]
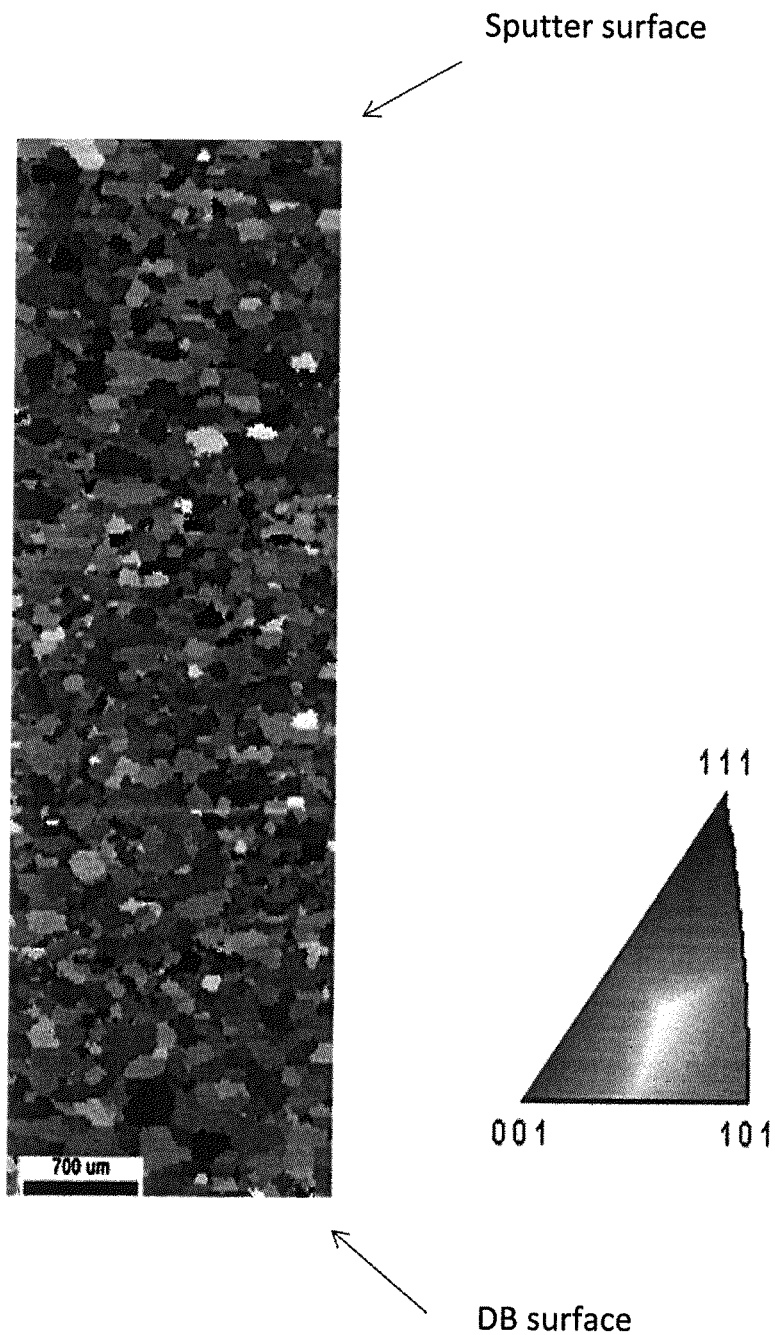

TANTALUM SPUTTERING TARGET, AND PRODUCTION METHOD THEREFOR

BACKGROUND

The present invention relates to a tantalum sputtering target suitable for forming a barrier seed layer in a wiring of a semiconductor integrated circuit, and particularly relates to a tantalum sputtering target capable of realizing favorable thickness uniformity even under high-power sputtering conditions by moderately reducing the sputter rate (deposition rate), and a method for producing such a tantalum sputtering target.

The sputtering method for forming films from metals, ceramics and other materials has been used in numerous fields such as electronics, corrosion resistant materials and ornaments, catalysts, as well as in the manufacture of cutting/polishing materials and abrasion resistant materials. The sputtering method itself is a well-known method in the foregoing fields, and particularly in the electronics field, a tantalum sputtering target suitable for forming films of complex shapes or forming circuits is recently in demand.

Generally speaking, this tantalum target is manufactured by performing the forging and annealing (heat treatment) of an ingot or a billet obtained by subjecting a tantalum raw material to electron beam melting and casting, and thereafter performing rolling and finish processing (machining, polishing, etc.) thereto to process into a target. In this kind of production process, the cast structure of the ingot or billet obtained via melting/casting will be destroyed by being subject to forging and recrystallization annealing, and uniform and fine crystal grains are consequently obtained.

When performing sputtering, as the crystal grains of the target are finer and more uniform, more uniform deposition is enabled and a film with stable characteristics can be obtained. Furthermore, it is also effective to align the crystal orientation across the thickness direction of the entire target to improve the uniformity of deposition. Note that the following background art are known in relation to a tantalum sputtering target (Patent Documents 1 to 11).

In recent years, high-power sputtering by magnetron sputtering equipment is being performed to increase the deposition rate of sputtering. Meanwhile, the wiring width of semiconductor integrated circuits becomes even more refined, but with high-power sputtering, there is a problem in that the uniformity of the film thickness cannot be controlled because the deposition rate is too high to form a uniform film in a leading-edge micro wiring pattern. In particular, this problem is notable when forming an ultra-thin film on wiring holes having a large aspect ratio.

CITATION LIST

Patent Documents

Patent Document 1: JP 2004-107758 A
Patent Document 2: WO 2006/117949
Patent Document 3: JP H11-080942 A
Patent Document 4: JP 2004-162117 A
Patent Document 5: WO 2004/090193
Patent Document 6: WO 2005/045090
Patent Document 7: JP 2008-532765 A
Patent Document 8: JP 2007-536431 A
Patent Document 9: JP 2002-530534 A
Patent Document 10: JP 2002-363736 A
Patent Document 11: JP 2001-295035 A

SUMMARY

An object of the present invention is to provide a tantalum sputtering target which enables the deposition rate to be moderately reduced under high-power sputtering conditions. When sputter-deposition is performed using this kind of a tantalum target, it is possible to form a thin film having superior film thickness uniformity and improve the productivity of the thin film formation process, even for micro wiring.

As a result of intense study to achieve the foregoing object, the present inventors discovered that, if the structural orientation of a tantalum sputtering target is caused to be a predetermined state by devising the rolling method, the deposition rate can be moderately reduced even under high-power sputtering conditions, and the film thickness can be controlled thereby, and therefore, a thin film having superior film thickness uniformity can be formed even for micro wiring.

Based on the foregoing discovery, the present invention provides a tantalum sputtering target, wherein, when observation is made of orientations of crystal grains constituting the target in relation to a direction normal to a sputtering surface of the target along a cross section perpendicular to the sputtering surface of the target by using an electron backscatter diffraction pattern method, a total area of areas of crystal grains having an orientation such that a $\{100\}$ plane is oriented in the ND direction has an area ratio of 30% or more to an area of the cross section in which the observation is made. In addition, when observation is made of orientations of crystal grains constituting the target in relation to a direction normal to a sputtering surface of the target along a cross section perpendicular to the sputtering surface of the target by using an electron backscatter diffraction pattern method, and when an area ratio of the crystal grains for $\{hkl\}$ plane is defined as a ratio of a total area of areas of the crystal grains having an orientation such that the $\{hkl\}$ plane thereof is oriented in the ND direction to an area of the cross section in which the observation is made and is written as $A\{hkl\}$, $A_{\{100\}}/A_{\{111\}}$ is 1.5 or more, where $A_{\{100\}}$ and $A_{\{111\}}$ represent area ratios of the crystal grains for $\{100\}$ plane and $\{111\}$ plane, respectively.

According to the present invention, the deposition rate can be moderately reduced and the film thickness can be controlled even under high-power sputtering conditions by causing the structural orientation of a tantalum sputtering target to be a predetermined state, and therefore, a thin film having superior film thickness uniformity can be formed even for micro wiring. In particular, the present invention yields a significant effect of being able to form a uniform thin film on wiring holes having a large aspect ratio.

BRIEF DESCRIPTION OF DRAWINGS

FIG. 1 This is a diagram showing the positions where the structure of the sputtering target was observed.

FIG. 2 This is a diagram showing the positions where the sheet resistance of the film formed on the wafer was measured.

FIG. 3 This is a diagram showing the crystal orientation distribution of the target of Example 1 based on EBSP observation.

DETAILED DESCRIPTION

The sputtering target of the present invention is characterized in that, when observation is made of orientations of crystal grains constituting the target in relation to a direction normal to a sputtering surface of the target along a cross section perpendicular to the sputtering surface of the target by using an electron backscatter diffraction pattern method (EBSP method), a total area of areas of crystal grains having an orientation such that a {100} plane is oriented in the ND direction has an area ratio of 30% or more to an area of the cross section in which the observation is made. With regard to the area ratio, an EBSP device (JSM-7001 FTTLS-type field emission microscope/crystal orientation analyzing device OIM6.0-CCD/BS) is used to observe the structure of the cross section (width: 2 mm, height: 6.35 mm) perpendicular to the sputtering surface as shown in FIG. 1 (right diagram) at five positions as shown in FIG. 1 (left diagram) and obtain an average area ratio of crystal grains of which the {100} plane is oriented in the ND.

With tantalum having a body-centered cubic structure, the atomic close-packed direction is <111>, and the relation of the sputtering surface and the close-packed direction is important in controlling the deposition rate. When the {100} plane is oriented in the direction normal to the rolling surface (ND), the angle of the close-packed direction relative to the direction normal to the sputtering surface will become large (wide). Thus, locations where the film is partially thick in the wafer plane will decrease, and a thin film having a favorable film thickness uniformity can be formed. Note that the crystal grains of which the {100} plane is oriented in the ND include the crystal grains of which the orientation deviation of the {100} plane relative to the direction normal to the rolling surface (ND) is within 15°. Furthermore, there is no particular limit in the upper limit of the area ratio of the crystal grains of which the {100} plane is oriented in the ND, but realistically speaking, it is difficult to achieve an area ratio of 60% or higher.

Moreover, with the present invention, when observation is made of orientations of crystal grains constituting the target in relation to a direction normal to a sputtering surface of the target along a cross section perpendicular to the sputtering surface of the target by using an electron backscatter diffraction pattern method (EBSP method), and when an area ratio of the crystal grains for {hkl} plane is defined as a ratio of a total area of areas of the crystal grains having an orientation such that the {hkl} plane thereof is oriented in the ND direction to an area of the cross section in which the observation is made and is written as A{hkl}, $A_{\{100\}}/A_{\{111\}}$ is preferably 1.5 or more, where $A_{\{100\}}$ and $A_{\{111\}}$ represent area ratios of the crystal grains for {100} plane and {111} plane, respectively. When the {111} plane is oriented in the direction normal to the rolling surface (ND), the close-packed direction coincides with the direction normal to the sputtering surface, and therefore the deposition rate will increase. Accordingly, as the proportion {100}/{111} is higher, the deposition rate can be reduced, and the film thickness can be controlled strictly. Note that the crystal grains of which the {111} plane is oriented in the ND include the crystal grains of which the orientation deviation of the {111} plane relative to the direction normal to the rolling surface (ND) is within 15°. Furthermore, the area ratio of the crystal grains of which the {111} plane is oriented in the ND is obtained in the same manner as the area ratio of the crystal grains having the {100} plane described above.

Moreover, in the present invention, the tantalum target desirably has a purity of 99.99% or higher. Because impurities in the target may cause the device characteristics of a semiconductor integrated circuit to deteriorate, a tantalum target having the highest purity is preferably used. In the present invention, the purity of 99.99% (4N) means that the total amount of Na, Al, Si, K, Ti, Cr, Mn, Fe, Co, Ni, Cu, Zn, and Zr is less than 100 ppm when analyzed via glow-discharge mass spectrometry (GDMS).

The method of producing the tantalum sputtering target of the present invention is as follows.

Foremost, tantalum is melted and cast to prepare an ingot, and the prepared ingot is thereafter forged. Subsequently, the ingot is subject to compaction forging to prepare a billet, and the prepared billet is cut into an appropriate size and then subject to heat treatment. Furthermore, the billet is subject to primary forging, primary heat treatment, and secondary forging, divided into two pieces, and then subject to secondary heat treatment (preferably 950 to 1100° C.). The present invention is not particularly limited to the foregoing processes, and the frequency of forging and the temperature of the heat treatment may be suitably selected in order to adjust the forged structure.

Next, 1) the obtained material is rolled consecutively two or more times in one direction, and 2) rotated 90 degrees and then additionally rolled consecutively two or more times. These processes are repeated (1→2→1→2→ . . . ) in two sets or more to subsequently obtain a predetermined plate thickness. The foregoing rolling processes are adjusted so that the structural orientation is controlled at a rolling reduction of less than 6% and the total rolling rate is 85% or higher. The number of rolling passes at a rolling reduction of less than 6% contributes considerably to controlling the orientation, and the {100} orientation ratio can be increased when the number of passes is greater. Meanwhile, since the rolling workload will increase when the number of passes is greater, it is important to appropriately adjust the conditions regarding the number of passes. Furthermore, heat treatment may also be performed during the rolling process, but it is recommended that heat treatment is performed (preferably, for 4 hours or longer) at 750 to 1000° C. after the final rolling as described above, rather than heat treatment performed during the rolling process.

Next, the rolled material is subject to heat treatment preferably at 750 to 1000° C. for 1 hour or longer, and thereafter machined into an intended shape to obtain a target. It is thereby possible to effectively destroy the forged structure and obtain a uniform and fine structure based on the rolling process. With regard to the texture of the present invention formed via the rolling process and heat treatment described above, the intended structural orientation can be obtained by comprehending which plane is preferentially oriented based on the EBSP method, and feeding back the results to the rolling process and heat treatment conditions.

EXAMPLES

The present invention is now explained in detail with reference to the Examples. These Examples are merely illustrative, and the present invention shall in no way be limited thereby. In other words, the present invention covers the other modes and modifications included in the technical concept of this invention.

The evaluation method adopted in the Examples and Comparative Examples is as follows.

(Film Thickness Uniformity and Rate of Variability Thereof)

The film thickness uniformity and the rate of variability thereof are evaluated using the "average value" and the "standard deviation" of the rate of variability of the film thickness (standard deviation/average value×100) of each target life (of each wafer). The target life can be represented as the integration of the power during sputtering and the total sputtering time. For example, when sputtering is performed at a power of 15 kW for 100 hours, the target life will be 1500 kWh.

As a specific evaluation method, foremost, sputtering is performed for every 300 kWh (power of 300 kW for 1 hour) to form a film on a total of 7 wafers. Subsequently, the in-plane sheet resistance at 49 locations of each wafer is measured as shown in FIG. 2, the obtained values are converted into a film thickness (resistance value of tantalum is deemed 180 μΩcm), and the average value and the standard deviation of the film thickness are thereby obtained. Then, calculation is performed for each wafer based on the in-plane rate of variability of film thickness (%)=standard deviation/average value×100, and the "average value" of the rate of variability of film thickness calculated for each wafer is used as the film thickness uniformity. As the "rate of variability" of the film thickness uniformity, standard deviation/average value (corresponding to film thickness uniformity)×100 among wafers (relative to the target life) is calculated utilizing the "rate of variability of film thickness" of each wafer obtained above.

Example 1

A tantalum raw material having a purity of 99.997% was subject to electron beam melting and cast to prepare an ingot having a length of 1000 mm and a diameter of 195 mmφ. Subsequently, the ingot was subject to cold compaction forging to obtain a diameter of 150 mm, and thereafter cut to a required length to obtain a billet. Next, the billet was subject to heat treatment at a temperature of 1250° C., once again subject to cold primary forging, subject to heat treatment at 1000° C., then subject to cold secondary forging, divided into two, and once again subject to heat treatment at 1000° C.

Subsequently, the forged billet was subject to cold rolling. The rolling process was performed by repeating continuous rolling passes at a rolling reduction of less than 6% for a total of 30 times, and thereafter performing a rolling pass at a rolling reduction of 6% or more. After the rolling process, the rolled material was subject to heat treatment at 800° C. Next, finish machining was performed to the obtained target material having a thickness of 10 mm and a diameter of 500 mmφ to prepare a tantalum sputtering target having a thickness of 6.35 mm and a diameter of 450 mmφ.

The surface of the tantalum sputtering target obtained based on the foregoing processes was polished with an abrasive paper (equivalent to #2000), additionally subject to buffing with a Polipla solution to be mirror-finished, and thereafter treated with a mixed liquid of hydrofluoric acid, nitric acid, and hydrochloric acid. An EBSP device (JSM-7001 FTTLS-type field emission microscope/crystal orientation analyzing device OIM6.0-CCD/BS) was used to observe the structure of the cross section (width: 2 mm, height: 6.35 mm) perpendicular to the sputtering surface at five positions of the obtained polished surface as shown in FIG. 1. Moreover, FIG. 3 shows the crystal orientation distribution. Consequently, the area ratio of the crystal grains of which the {100} plane is oriented in the ND was 49.5%. The area ratio of the crystal grains of which the {111} plane is oriented in the ND was 14.3%. Furthermore, the proportion of the foregoing area ratios, {100}/{111}, was 3.46. Next, as a result of sputtering this target, the film thickness uniformity was 2.1 and the rate of variability of the film thickness uniformity was 4, and favorable results were obtained. Moreover, the deposition rate was 5.5 Å/second, and the intended sputter rate was obtained. The results are shown in Table 1.

Examples 2-5

A forged billet was prepared in the same manner as Example 1. Next, the forged billet was subject to cold rolling. The rolling process was performed by adjusting the total number of continuous rolling passes at a rolling reduction of less than 6% as shown in Table 1, and thereafter performing a rolling pass at a rolling reduction of 6% or more so that the total rolling reduction will be 85% or more. After the rolling process, the rolled material was subject to heat treatment at 800° C. Next, finish machining was performed to the obtained target material having a thickness of 10 mm and a diameter of 500 mmφ to prepare a tantalum sputtering target having a thickness of 6.35 mm and a diameter of 450 mmφ.

With regard to the sputtering target obtained based on the foregoing processes, the structure of the cross section perpendicular to the sputtering surface of the target was observed in the same manner as Example 1. Consequently, the area ratio of the crystal grains of which the {100} plane is oriented in the ND was 30% or more in all cases. Furthermore, the proportion of the foregoing area ratios, {100}/{111}, was 1.5 or more in all cases (excluding Example 4). Next, as a result of sputtering this target, the film thickness uniformity and the rate of variability of the film thickness uniformity were both favorable in all cases. Moreover, the deposition rate was the intended sputter rate. The results are similarly shown in Table 1.

Comparative Examples 1-5

A forged billet was prepared in the same manner as Example 1. Next, the forged billet was subject to cold rolling. The rolling process was performed by adjusting the total number of continuous rolling passes at a rolling reduction of less than 6% as shown in Table 1, and thereafter performing a rolling pass at a rolling reduction of 6% or more so that the total rolling reduction will be 85% or more. After the rolling process, the rolled material was subject to heat treatment at 800° C. Next, finish machining was performed to the obtained target material having a thickness of 10 mm and a diameter of 350 mmφ to prepare a tantalum sputtering target having a thickness of 6.35 mm and a diameter of 320 mmφ.

With regard to the sputtering target obtained based on the foregoing processes, the structure of the cross section perpendicular to the sputtering surface of the target was observed in the same manner as Example 1. Consequently, the area ratio of the crystal grains of which the {100} plane is oriented in the ND was less than 30% in all cases. Furthermore, the proportion of the foregoing area ratios, {100}/{111}, was less than 1.5 in all cases. Next, as a result of sputtering this target, the film thickness uniformity and/or the rate of variability of the film thickness uniformity deteriorated in all cases. Moreover, the sputter rate was high. The results are similarly shown in Table 1.

TABLE 1

| Ta | Number of continuous roll passes of less than 6% | (100) area ratio | (111) area ratio | (100)/(111) | Film thickness uniformity | Variation of film thickness uniformity (%) | Deposition rate (Å/second) | Evaluation |
| --- | --- | --- | --- | --- | --- | --- | --- | --- |
| Example 1 | 30 | 49.5 | 14.3 | 3.46 | 1.8 | 3 | 5.4 | ◉ |
| Example 2 | 24 | 47.4 | 16.0 | 2.96 | 1.9 | 4 | 5.5 | ◉ |
| Example 3 | 24 | 42.7 | 20.1 | 2.12 | 2.0 | 5 | 5.6 | ○ |
| Example 4 | 18 | 37.0 | 25.5 | 1.45 | 2.1 | 7 | 5.8 | ○ |
| Example 5 | 12 | 35.4 | 20.8 | 1.70 | 2.4 | 9 | 5.7 | ○ |
| Comparative Example 1 | 10 | 24.4 | 27.9 | 0.87 | 2.6 | 10 | 6.1 | Δ |
| Comparative Example 2 | 8 | 23.7 | 33.8 | 0.70 | 2.5 | 13 | 6.3 | Δ |
| Comparative Example 3 | 6 | 20.3 | 34.8 | 0.58 | 2.5 | 16 | 6.4 | Δ |
| Comparative Example 4 | 4 | 19.7 | 38.6 | 0.51 | 2.7 | 16 | 6.7 | X |
| Comparative Example 5 | 2 | 15.5 | 40.5 | 0.38 | 2.9 | 20 | 6.9 | X |

Criteria
◉ → Deposition rate: less than 5.6; Variation of film thickness uniformity: less than 5
○ → Deposition rate: 5.6 to less than 6.0; Variation of film thickness uniformity: 5.0 to less than 10.0
Δ → Deposition rate: 6.0 to less than 6.5; Variation of film thickness uniformity: 10 or more
X → Deposition rate: 6.5 or more; Variation of film thickness uniformity: 10 or more

INDUSTRIAL APPLICABILITY

According to the present invention, the deposition rate can be moderately reduced and the film thickness can be controlled even under high-power sputtering conditions by causing the structural orientation of a tantalum sputtering target to be a predetermined state, and therefore, a thin film having superior film thickness uniformity can be formed even for micro wiring. The present invention is effective as a tantalum sputtering target for use in forming a thin film of an element wiring of a semiconductor integrated circuit.

The invention claimed is:
1. A tantalum sputtering target, wherein orientations of crystal grains constituting the tantalum sputtering target observed via an electron backscatter diffraction pattern method in relation to a direction normal to a sputtering surface of the tantalum sputtering target, ND, along a cross section of the tantalum sputtering target perpendicular to the sputtering surface are such that:
a total area of areas of crystal grains having a {100} plane oriented in the ND direction observed in the cross section of the tantalum sputtering target has an area ratio of 30% or more relative to a total area of the cross section of the tantalum sputtering target observed; and
$A_{\{100\}}/A_{\{111\}}$ is 1.5 or more, where $A_{\{100\}}$ represents an area ratio of the total area of areas of crystal grains having a {100} plane oriented in the ND direction observed in the cross section of the tantalum sputtering target relative to the total area of the cross section of the tantalum sputtering target observed and $A_{\{111\}}$ represents an area ratio of a total area of areas of crystal grains having a {111} plane oriented in the ND direction observed in the cross section of the tantalum sputtering target relative to a total area of the cross section of the tantalum sputtering target observed.

* * * * *